US007002251B2

(12) United States Patent
Egawa

(10) Patent No.: US 7,002,251 B2
(45) Date of Patent: Feb. 21, 2006

(54) SEMICONDUCTOR DEVICE

(75) Inventor: Yoshimi Egawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 50 days.

(21) Appl. No.: 10/796,058

(22) Filed: Mar. 10, 2004

(65) Prior Publication Data

US 2005/0046035 A1 Mar. 3, 2005

(30) Foreign Application Priority Data

Sep. 3, 2003 (JP) ............................ 2003-310987

(51) Int. Cl.
*H01L 23/48* (2006.01)
*H01L 23/52* (2006.01)
*H01L 29/40* (2006.01)

(52) U.S. Cl. ....................... 257/734; 257/777; 257/784

(58) Field of Classification Search ................ 257/734, 257/777, 784

See application file for complete search history.

(56) References Cited

FOREIGN PATENT DOCUMENTS

JP 2002-124625 4/2002

*Primary Examiner*—Long Pham
(74) *Attorney, Agent, or Firm*—Rabin & Berdo, PC

(57) ABSTRACT

A semiconductor device includes a substrate, and a recess is formed in the substrate. A back surface of the substrate is covered with an insulating film, and wiring, pads and posts are formed on the insulating film. The pads are connected to the posts by the wiring. The entire back surface of the substrate except for areas of the pads and the posts is covered with the insulating film. External terminals, such as solder balls, are formed on the posts. A first chip is fixed to the pads within the recess, and a second chip is adhered to the first chip with an adhesive. The first chip and the second chip respectively have a wafer level chip size package (WCSP) structure where external terminals are arranged planarly by rewiring from internal electrodes which are provided with an insulating coating.

17 Claims, 10 Drawing Sheets

F I G. 7
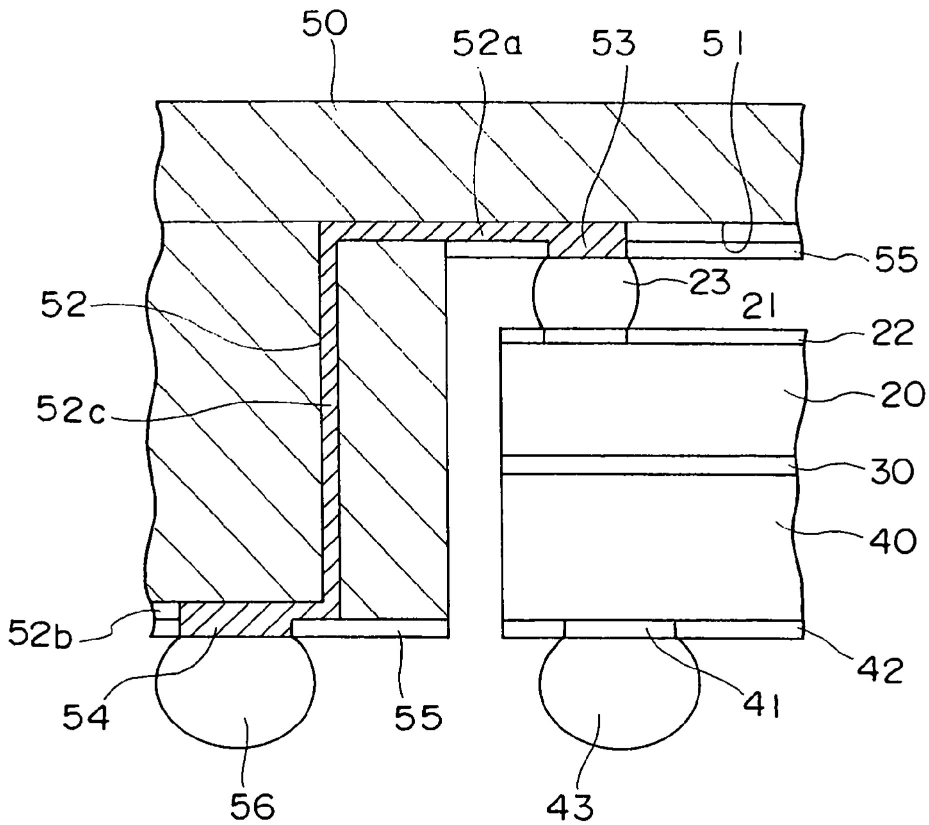
F I G. 8
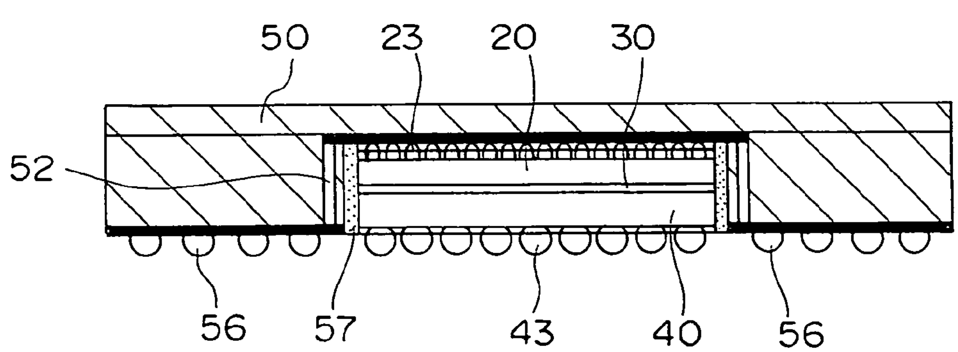

SEMICONDUCTOR DEVICE

CROSS-REFERENCE TO RELATED APPLICATION

This application claims priority under 35 USC 119 from Japanese Patent Application No. 2003-310987, the disclosure of which is incorporated by reference herein.

BACKGROUND OF THE INVENTION

1. Field of the Invention

The present invention relates to a semiconductor device, and more particularly, to a semiconductor device which can be made thinner than conventional semiconductor devices and enables high-density mounting, and can be produced by a simple production process.

2. Description of the Related Art

Conventionally known semiconductor devices which enables high-density mounting include those having a Multi-Chip-Package (hereinafter referred to as "MCP") structure, in which a plurality of chips are mounted in a single package.

For example, in a 2-chip lamination type MCP, when two chips having the same or almost the same chip size are laminated, a lower chip is fixed on a substrate with an adhesive, a spacer such as a silicon piece or a piece of tape is fixed on the lower chip with an adhesive, and then, wires connecting the lower chip to bonding posts on the substrate are provided by wire bonding. Subsequently, an upper chip is fixed on the spacer with an adhesive, and wires connecting the upper chip to bonding posts on the substrate are provided by wire bonding. Then, the lower chip, the upper chip and the wires are sealed with a resin, and external terminals are attached to a back surface of the substrate.

However, since the spacer is used in such MCPs, the structure thereof becomes triple layer structure. This increases the thickness of the entire package, as well as assembly steps, material costs and assembly costs.

An example of a semiconductor device having the MCP structure which has solved the above-described problem is described in Japanese Patent Application Laid-Open (JP-A) No. 2002-124625.

In the semiconductor device described in the above patent document, an opening is formed in the substrate, and a lower chip is accommodated in the opening with its front surface facing down. On a back surface of the lower chip, a back surface of an upper chip, which has, for example, the same or almost the same size as the lower chip, is fixed. Wires connecting the upper chip to bonding posts on the front surface of the substrate are provided by wire bonding, and the upper chip and the wires are sealed with a resin. Terminals are disposed on a back surface of the substrate, and the terminals are electrically connected to the bonding posts at the front surface via through holes.

In such MCPs, two chips, which have the same or almost the same chip size, can be laminated without use of a spacer therebetween. Therefore, the above-described drawback can be eliminated.

However, conventional semiconductor devices, such as that of the above-sited patent document, have the following problems.

Since the upper chip is electrically connected to the substrate with wires, the wire bonding operation requires many steps. Further, since the wires and the upper chip are sealed with a resin in order to protect the wires, which are bent upward and downward and are loose, and the like, the thickness of the package increases by the height of the wire portions, and the like. Moreover, since use of a metal mold is necessary to provide the resin seal, the sealing operation requires many steps.

SUMMARY OF THE INVENTION

An object of the present invention is to provide a semiconductor device which can solve the above-described prior-art problems, which can be made thinner than conventional semiconductor devices and enables high-density mounting, and can be produced by a simple production process.

In order to solve the above-described problems, a semiconductor device according to a first aspect of the invention includes a substrate, pads, first external terminals, wiring, a first semiconductor element (hereinafter referred to as a "chip") and a second chip.

The substrate includes opposed first and second surfaces, and a recess which is depressed in a direction from the first surface to the second surface is formed. The first surface including the recess is covered with an insulating film. The pads are formed on the insulating film at a bottom surface of the recess. The first external terminals are formed on the insulating film on the first surface at an area surrounding the recess. The wiring is formed on the insulating film on the first surface and electrically connects the pads to the first external terminals.

The first chip includes a third surface, on which second external terminals are formed, and a fourth surface opposed to the third surface. The first chip is accommodated in the recess, and the second external terminals are electrically connected to the pads. Further, the second chip includes a fifth surface, on which third external terminals are formed, and a sixth surface opposed to the fifth surface. The second chip is accommodated in the recess, and the sixth surface thereof is adhered to the fourth surface of the first chip.

A semiconductor device of a second aspect of the invention is the semiconductor device of the first aspect, wherein the substrate is a metal substrate.

A semiconductor device of a third aspect of the invention is the semiconductor device of the first aspect, wherein the third external terminals are disposed at the same height as the first external terminals.

A semiconductor device of a fourth aspect of the invention is the semiconductor device of any one of the first to third aspects, wherein a stepped area is formed in the recess of the substrate, the second chip is accommodated in the recess and the sixth surface thereof is fixed to the fourth surface and the stepped area, and the third external terminals are disposed at the same height as the first external terminals.

A semiconductor device of a fifth aspect of the invention includes an insulative substrate, pads, first external terminals, wiring, a first chip and a second chip.

The insulative substrate includes opposed first and second surfaces, and a recess having predetermined dimensions is formed in the first surface. The pads are formed at a bottom surface of the recess. The first external terminals are formed on the first surface at an area surrounding the recess. The wiring is formed on the substrate and electrically connects the pads to the first external terminals.

The first chip includes a third surface, on which second external terminals are formed, and a fourth surface opposed to the third surface. The first chip is accommodated in the recess and the second external terminals are fixed to the pads. Further, the second chip includes a fifth surface, on which third external terminals are formed, and a sixth surface opposed to the fifth surface. The second chip is accommodated in the recess, the sixth surface thereof is fixed to the fourth surface, and the third external terminals are disposed at the same height as the first external terminals.

A semiconductor device of a sixth aspect of the invention includes an insulative substrate, pads, first internal connection terminals, first external terminals, wiring, a first chip and a second chip.

The insulative substrate includes opposed first and second surfaces, and a recess having predetermined dimensions is formed in the first surface. The pads are formed at a bottom surface of the recess. The first internal connection terminals are formed on the first surface at an area surrounding the recess. The first external terminals are formed on the first surface at outer sides than the first internal connection terminals. The wiring is formed on the substrate and electrically connects the pads to the first internal connection terminals and the first external terminals.

The first chip includes a third surface, on which second external terminals are formed, and a fourth surface opposed to the third surface. The first chip is accommodated in the recess and the second external terminals are fixed to the pads. Further, the second chip includes a fifth surface, on which third external terminals are formed and second internal connection terminals are formed in the vicinity of an outer edge at outer sides than the third external terminals, and a sixth surface opposed to the fifth surface. The second chip is accommodated in the recess, the sixth surface thereof is fixed to the fourth surface, the second internal connection terminals are electrically connected to the first internal connection terminals, and the third external terminals are disposed at the same height as the first external terminals.

A semiconductor device of a seventh aspect of the invention is the semiconductor device of the fifth aspect, wherein the wiring includes a first wiring body formed at the bottom surface of the recess and electrically connected to the pads, a second wiring body formed on the first surface at an area surrounding the recess and electrically connected to the first external terminals, and a through hole formed in the substrate for electrically connecting the first wiring body to the second wiring body.

A semiconductor device of an eighth aspect of the invention is the semiconductor device of the sixth aspect, wherein the wiring includes a first wiring body formed at the bottom surface of the recess and electrically connected to the pads, a second wiring body formed on the first surface at an area surrounding the recess and electrically connected to the first internal connection terminals and the first external terminals, and a through hole formed in the substrate for electrically connecting the first wiring body to the second wiring body.

A semiconductor device of a ninth aspect of the invention is the semiconductor device of any one of the fifth to eighth aspects, wherein the substrate includes a first insulative substrate body and a second insulative substrate body. The second insulative substrate body includes an opening, which forms the recess, and is fixed to a back surface of the first substrate body.

A semiconductor device of a tenth aspect of the invention is the semiconductor device of any one of the fifth to ninth aspects, wherein a clearance between a wall surface of the recess and the first and second chips is sealed with a sealing body.

A semiconductor device of an eleventh aspect of the invention is the semiconductor device of any one of the fifth to tenth aspects, which further includes a heat sink fixed at the second surface of the substrate.

A semiconductor device of a twelfth aspect of the invention is the semiconductor device of any one of the fifth to eleventh aspects, wherein the first chip has a wafer level chip size package (hereinafter referred to as "WCSP") structure where the second external terminals are arranged planarly by rewiring from internal electrodes provided with an insulating coating, and the second chip has a WCSP structure where the third external terminals are arranged planarly by rewiring from internal electrodes provided with an insulating coating.

According to the semiconductor devices of the first, second, third and twelfth aspects of the invention, the second external terminals of the first chip are fixed to the pads within the recess of the metal substrate, and the sixth surface of the second chip is fixed to the fourth surface of the first chip. Therefore, the semiconductor device can be made thinner than conventional semiconductor devices and high-density mounting can be achieved. Further, a number of parts is smaller than that of conventional semiconductor devices and material costs can be reduced. Furthermore, a number of production steps is smaller than that of conventional semiconductor devices and productivity can be improved. Moreover, heat generated from the chips is dissipated by the metal substrate. This provides excellent heat dissipation, thereby reducing thermal damages on the chips.

According to the semiconductor device of the fourth aspect of the invention, the stepped area is formed in the recess of the substrate, and the sixth surface of the second chip is fixed to the stepped area and the fourth surface of the first chip. Therefore, a stress applied on portions, at which the second external terminals of the first chip are connected to the pads in the recess, can be reduced, thereby increasing connection strength with the substrate.

According to the semiconductor devices of the fifth and seventh aspects of the invention, the second external terminals of the first chip are fixed to the pads within the recess of the insulative substrate, and the sixth surface of the second chip is fixed to the fourth surface of the first chip. Therefore, the semiconductor device can be made thinner than conventional semiconductor devices and high-density mounting can be achieved. Further, a number of parts is smaller than that of conventional semiconductor devices and material costs can be reduced. Furthermore, a number of production steps is smaller than that of conventional semiconductor devices and productivity can be improved.

According to the semiconductor devices of the sixth and eighth aspects of the invention, the first and second chips are fixed in a laminated state within the recess of the insulative substrate, and the first and second chips are electrically connected to each other via the first and second internal connection terminals. This facilitates uniting the two chips to function together, and thus a high-value added semiconductor device can be provided.

According to the semiconductor device of the ninth aspect of the invention, the substrate is formed of the first and second substrate bodies. This facilitates forming the pads and the wiring.

According to the semiconductor device of the tenth aspect of the invention, the clearance between the wall surface of the recess and the first and second chips is sealed with the sealing body. Therefore, a stress applied on portions, at which the second external terminals of the first chip are connected to the pads in the recess, can be reduced, thereby increasing connection strength with the substrate and improving reliability.

According to the semiconductor device of the eleventh aspect of the invention, a heat sink is fixed at the second surface of the insulative substrate. Therefore, heat generated from the chips is dissipated by the heat sink. This provides excellent heat dissipation, thereby reducing thermal damages on the chips.

BRIEF DESCRIPTION OF THE DRAWINGS

FIG. 7 is a partially enlarged view of the semiconductor device of FIG. 6.

FIG. 8 is a sectional view showing a semiconductor device according to a fourth embodiment of the invention.

DETAILED DESCRIPTION OF THE INVENTION

A semiconductor device according to a first invention comprises a substrate. The substrate includes opposed first and second surfaces. A recess is formed which is depressed in a direction from the first surface to the second surface, and the first surface including the recess is covered with an insulating film. Pads are formed on the insulating film at a bottom surface of the recess of the substrate. Further, first external terminals are formed on the insulating film at an area surrounding the recess. Wiring is formed on the insulating film on the first surface of the substrate, and the wiring electrically connects the pads to the first external terminals.

A first chip includes a third surface, on which second external terminals are formed, and a fourth surface opposed to the third surface. The first chip is accommodated in the recess of the substrate and the second external terminals thereof are electrically connected to the pads within the recess. Further, a second chip includes a fifth surface, on which third external terminals are formed, and a sixth surface opposed to the fifth surface. The second chip is accommodated in the recess of the substrate and the sixth surface thereof is adhered to the fourth surface of the first chip.

A semiconductor device according to a second invention comprises an insulative substrate. The substrate includes opposed first and second surfaces. A recess having predetermined dimensions is formed in the first surface. Pads are formed at a bottom surface of the recess, and first external terminals are formed at an area surrounding the recess. Wiring is formed on the substrate, and the wiring electrically connects the pads to the first external terminals.

A first chip includes a third surface, on which second external terminals are formed, and a fourth surface opposed to the third surface. The first chip is accommodated in the recess of the substrate and the second external terminals thereof are fixed to the pads within the recess. A second chip includes a fifth surface, on which a third external terminals are formed, and a sixth surface opposed to the fifth surface. The second chip is accommodated in the recess of the substrate and the sixth surface thereof is fixed to the fourth surface of the first chip. The third external terminals provided on the fifth surface of the second chip are disposed at the same height as the first external terminals at the substrate.

First Embodiment

[Structure]

Figure 1A:
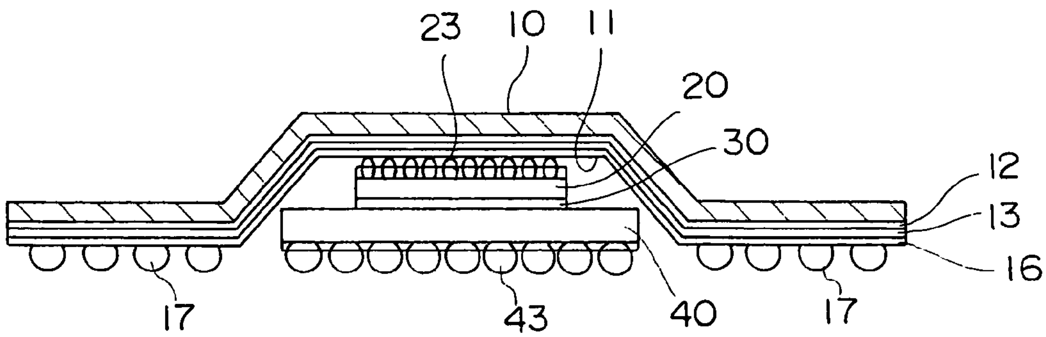
FIGS. 1A and 1B are structural diagrams showing a semiconductor device according to a first embodiment of the present invention.
Figure 1B:
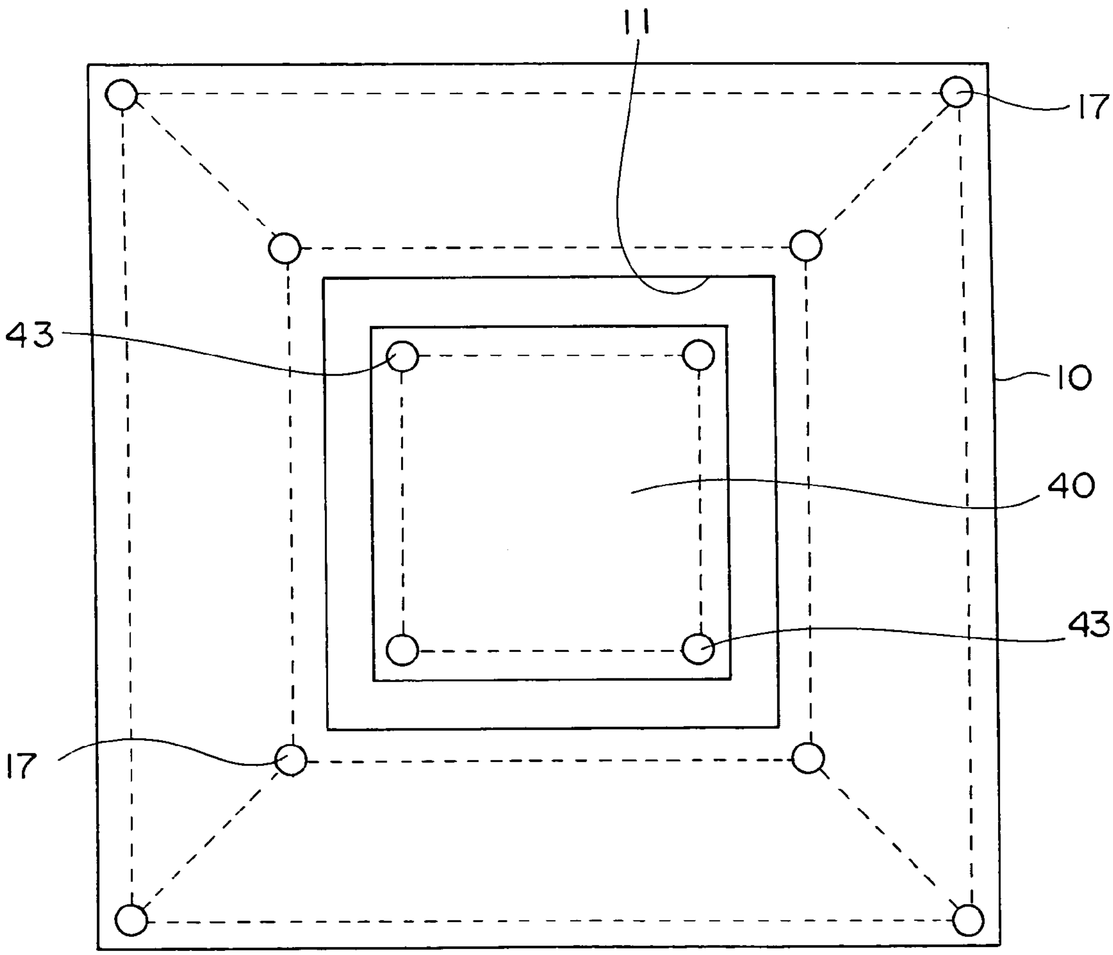
Figure 2:
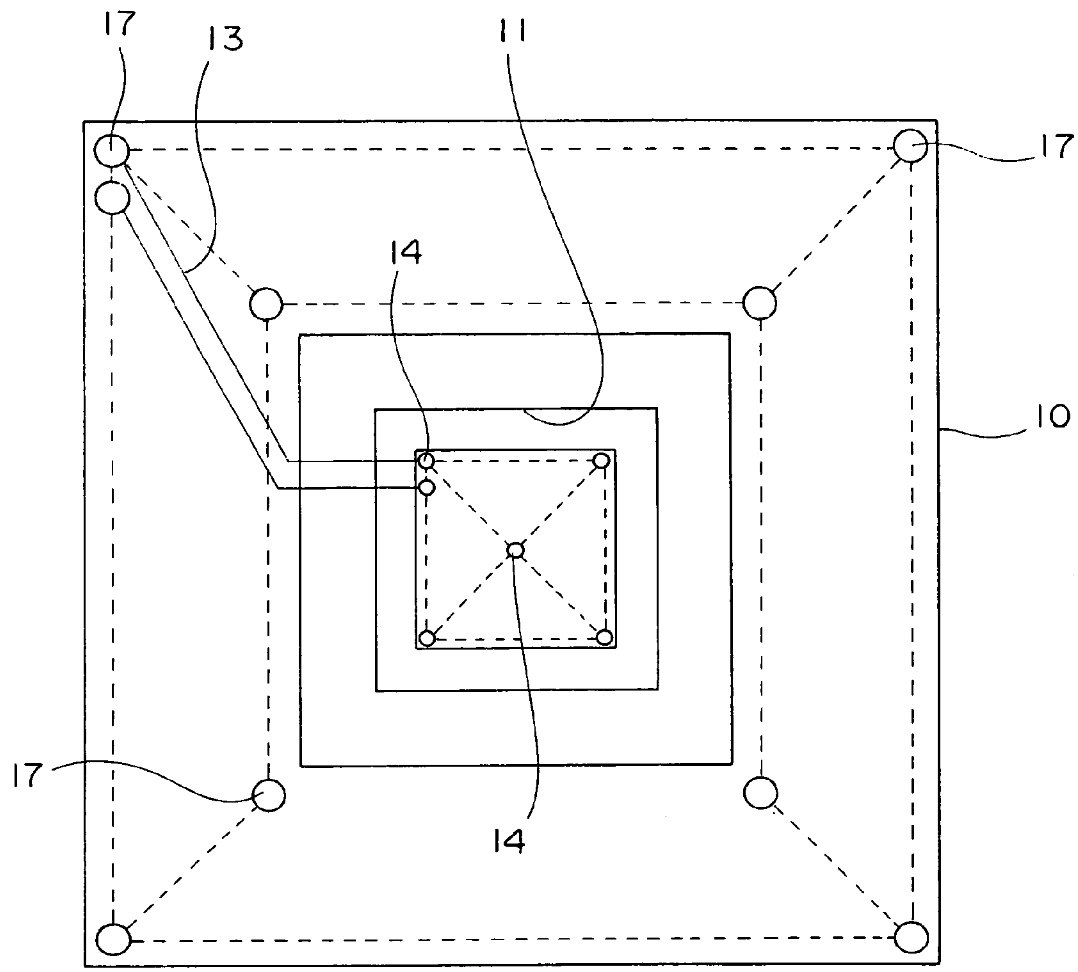
FIG. 2 is a bottom view showing a substrate in FIGS. 1A and 1B.
Figure 3:
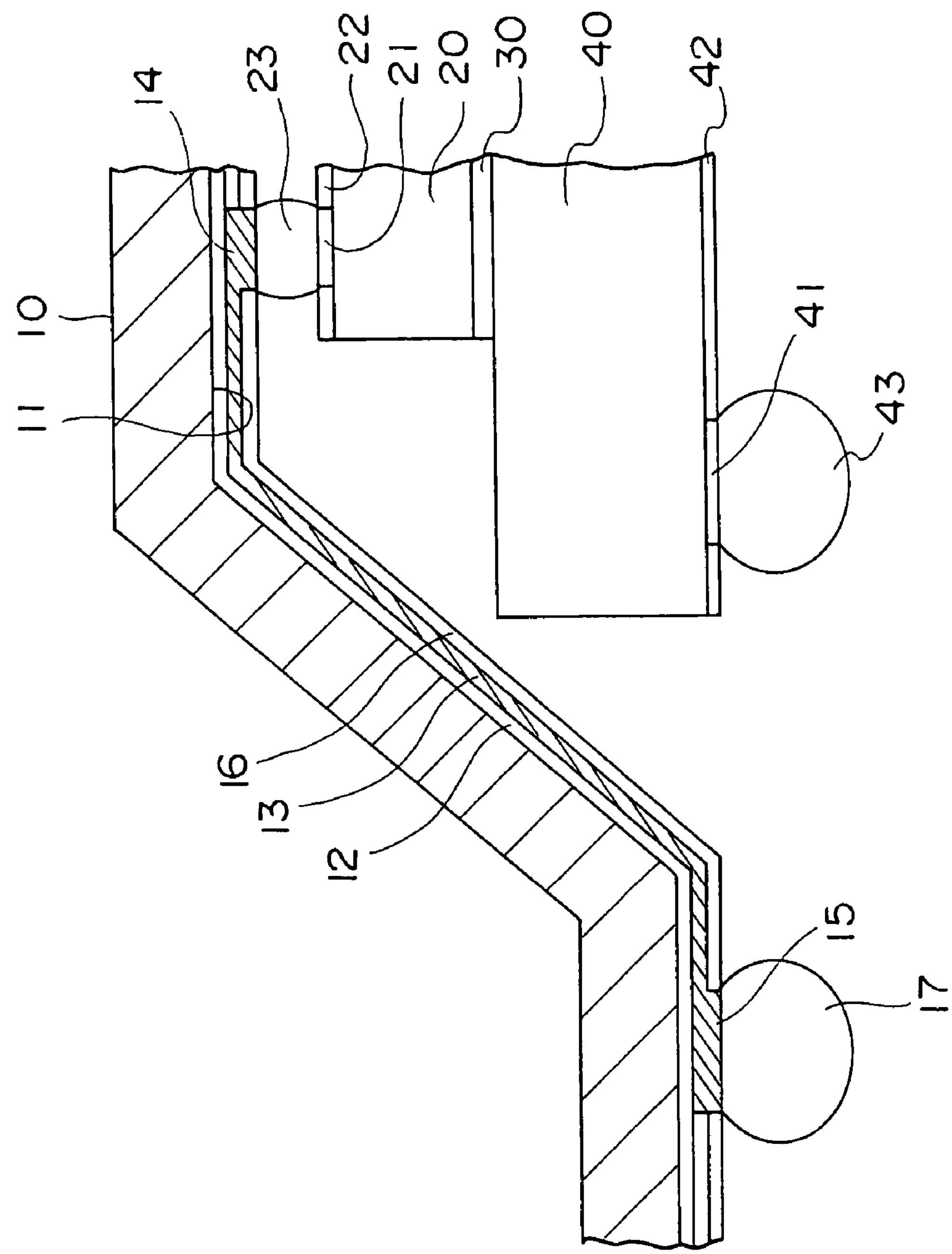
FIG. 3 is a partially enlarged sectional view of the semiconductor device of FIGS. 1A and 1B.

FIGS. 1A and 1B illustrate a structure of a semiconductor device of the first embodiment of the present invention. FIG. 1A is a sectional view and FIG. 1B is a bottom view (i.e., a back view). Further, FIG. 2 is a bottom view (i.e., a back view) of the substrate shown in FIG. 1, and FIG. 3 is a partially enlarged sectional view of the semiconductor device of FIG. 1.

The semiconductor device has, for example, a Ball Grid Array (hereinafter referred to as "BGA") structure in the 2-chip lamination MCP structure. The semiconductor device includes a metal substrate 10, which has an excellent heat dissipation property and is made, for example, of Cu (copper) or SUS (stainless steel). The substrate 10 includes opposed first (e.g., back) and second (e.g., front) surfaces. A recess 11 is formed there by drawing press, or the like, so as be depressed in a direction from the back surface to the front surface. The entire back surface of the substrate 10 including the recess 11 is covered with an insulating film 12 such as a polyimide resin. Using Cu, or the like, wiring 13, round pads 14 and round posts 15 are formed on the insulating film 12. The pads 14 are disposed on the insulating film 12 at a bottom surface of the recess 11, and the posts 15 are disposed on the insulating film 12 at an area surrounding the recess 11. Surfaces of the pads 14 and the posts 15 are respectively plated, for example, with Ni (nickel) or Au (gold). The wiring 13 formed on the insulating film 12 electrically connects the pads 14 to the posts 15. The entire back surface of the substrate except for the areas of the pads 14 and the posts 15 is covered with an insulating film 16 of polyimide resin, or the like. First external terminals 17, such as solder balls, are respectively formed on the posts 15.

A first chip 20 having the BGA structure is accommodated in the recess 11, and is fixed to the pads 14. The chip 20 includes opposed third (e.g., front) and fourth (e.g., back) surfaces, and has a WCSP structure containing circuit elements such as a memory and a logic circuit. Round posts 21 formed of Cu, or the like, are disposed on the front surface of the chip 20 so as to correspond to the pads 14 within the recess 11, and the posts 21 are connected to the internal circuit elements. The entire front surface of the chip except for the areas of the posts 21 is sealed with a sealing body 22 such as an epoxy resin. Second external terminals 23, such as solder balls, are respectively provided on the posts 21, and are aligned with and fixed to the pads 14.

A second chip 40 having the BGA structure and the same or almost the same size as the first chip 20 is fixed to the back surface of the first chip 20 with an insulative adhesive 30 such as a thermosetting insulative paste or a thermoplastic insulative film. The second chip 40 includes opposed fifth (e.g., front) and sixth (e.g., back) surfaces, and has a WCSP structure containing circuit elements such as a memory and a logic circuit, as with the first chip 20. Round posts 41 formed of Cu, or the like, are disposed on the front surface of the chip 40, and are connected to the internal circuit elements. The entire front surface of the chip except for the areas of the posts 41 is sealed with a sealing body 42 such as an epoxy resin. Third external terminals 43, such as solder balls, are respectively provided on the posts 41. The third external terminals 43 have the same diameter and the same height as the first external terminals 17.

[Example of Production Method]

FIGS. 4A to 4I illustrate steps in a production method for the chip (such as the chip 20) as shown in FIGS. 1A and 1B.

When the semiconductor device of FIGS. 1A and 1B is produced, the chips 20 and 40 are produced in advance, for example, by the following production steps.

Figure 4A:
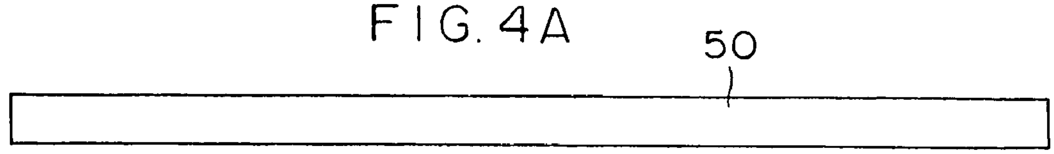
FIGS. 4A–4I are diagrams illustrating production steps for producing the chip of FIGS. 1A and 1B.
Figure 4B:
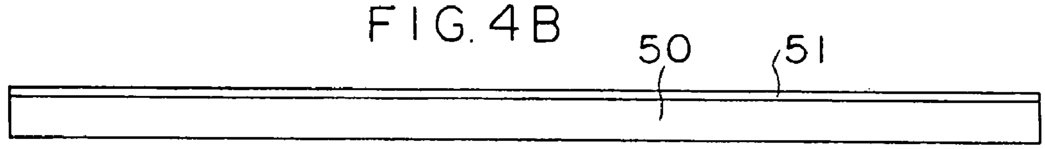
Figure 4C:
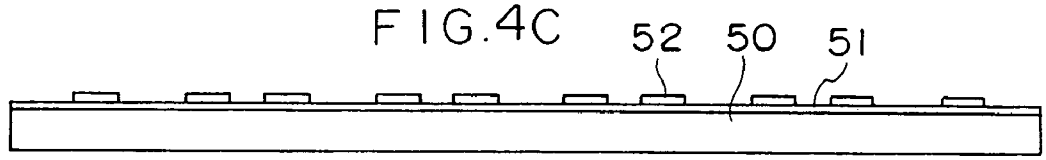
Figure 4D:
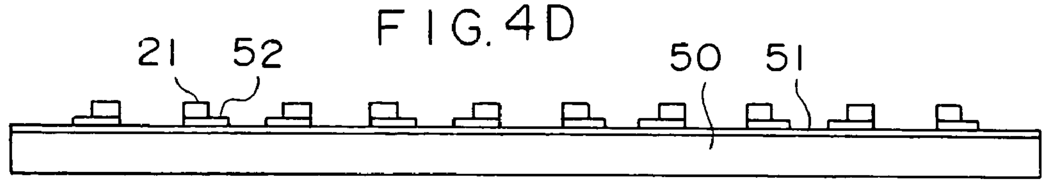

As shown in FIG. 4A, circuit elements are fabricated on a silicon wafer 50 by diffusion, photo etching, and the like, and a plurality of electrodes (for example, Al pads) are formed on the surface. Then, in FIG. 4B, the entire surface is covered with an insulating film 51 such as a polyimide coating. In FIG. 4C, rewiring 52 plated with Cu, or the like, is formed on the insulating film 51 for repositioning the pads. The rewiring 52 is electrically connected to the pads under the insulating film 51 at predetermined points. Then, in FIG. 4D, the bump-like posts 21 having a predetermined size are formed on the rewiring 52 using Cu, or the like.

Figure 4E:
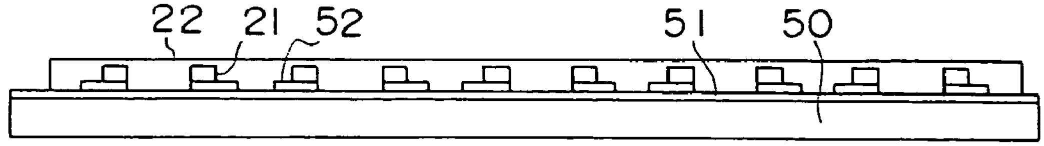
Figure 4F:
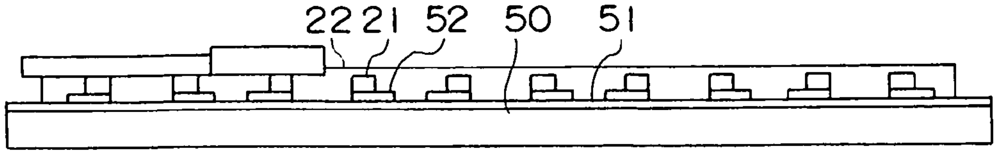
Figure 4G:
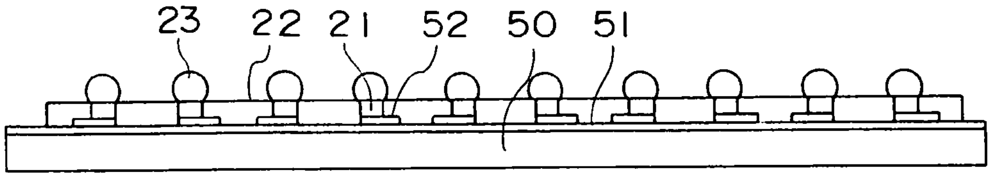
Figure 4H:
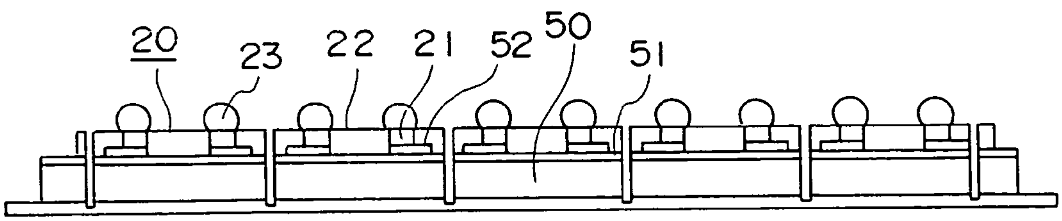
Figure 4I:
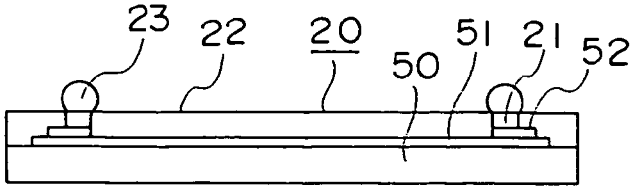

In FIG. 4E, the entire surface including the posts 21 is sealed with the sealing body 22 such as an epoxy resin using a transfer method, and are ground until the posts 21 are exposed, as shown in FIG. 4F. In FIG. 4G, the external terminals 23, such as solder balls, are formed on the exposed posts 21 to form the BGA structure. In FIG. 4H, good chips and defective chips are determined by probing and the wafer is divided into individual chips 20 by dicing. Then, in FIG. 4I, appearances of the chips are inspected and only good chips are used in the next operation.

Using chips 20 and 40 having the BGA structure formed by the WCSP as described above, the semiconductor device shown in FIGS. 1A and 1B is produced, for example, in the following manner.

First, the insulating film 12 such as a polyimide resin, which forms a complete insulation on the substrate 10, is formed on the entire back surface of the substrate 10, which is made of a metal such as Cu and has an excellent heat dissipation property. Thereafter, using Cu, or the like, sets of the wiring 13, the round pads 14 within the area which will be the recess, and the round posts 15 at the area surrounding the area to be the recess are respectively formed at a plurality of sites of the substrate 10. Subsequently, the insulating film 16 such as a polyimide resin is formed over the entire back surface of the substrate, except for the areas of the pads 14 and posts 15 formed at the plurality of sites, and the pads 14 and the post 15 are plated, for example, with Ni or Au. Then, for each of the plurality of sites of the substrate 10, the recess 11 is formed at the area to be the recess by drawing press to predetermined dimensions using a metal mold, or the like. Drawing dimensions are determined according to the size and thickness of the chips 20 and 40 to be mounted.

After the plurality of sites of the substrate 10 are drawn, the external terminals 23, such as solder balls, disposed at the front surface of each of the chips 20 are aligned with and fixed to the pads 14 within each of the recesses 11, and are electrically connected thereto. Then, the adhesive 30, such as a thermosetting insulative paste or a thermoplastic insulative film, is formed on each of the back surfaces of the chips 20, and the back surfaces of the chips 40 are respectively adhered thereto. The external terminals 43, such as solder balls, disposed at the front surface of each of the chips 40 are oriented in the same direction as the posts 15 on the substrate 10. Thereafter, the external terminals 17 such as solder balls, which have the same diameter and the same height as the external terminals 43 on the chip 40, are formed respectively on the posts 15 disposed at the plurality of sites of the substrate 10. Then, the sites of the substrate 10, on which the chips are mounted, are cut and divided into individual pieces to obtain the semiconductor devices having the BGA structure as shown in FIGS. 1A and 1B.

[Operation]

The external terminals 23 of the first chip 20 are electrically connected to the external terminals 17 via the pads 14, the wiring 13 and the posts 15 at the back surface of the substrate 10. Therefore, by mounting the external terminals 17 of the substrate 10 and the external terminals 43 of the second chip 40 onto a circuit board, or the like, the first and second chips 20 and 40 are electrically connected to the circuit board, or the like, and the semiconductor device performs predetermined operations.

[Effects]

In the first embodiment, the two chips 20 and 40 having the WCSP structure are laminated on the metal substrate 10, and the following effects (1) to (4) are obtained.

(1) The external terminals 23 of the first chip 20 are fixed to the pads 14 within the recess 11 of the substrate 10, and the back surface of the second chip 40 is adhered to the back surface of the first chip 20 with the adhesive 30. Therefore, a number of parts is smaller than that of conventional semiconductor devices and material costs can be reduced.

(2) Since the two chips 20 and 40 are mounted within the recess 11 of the substrate 10, as with the above (1), a number of production steps is smaller than that of conventional semiconductor devices and productivity can be improved.

(3) Since the two chips 20 and 40 are mounted on the metal substrate 10, heat generated from the chips 20 and 40 is dissipated by the metal substrate 10. This provides excellent heat dissipation, thereby reducing thermal damages on the chips 20 and 40.

(4) Since the front surface of the first chip 20 is fixed within the recess 11 of the substrate 10 and the back surface of the second chip 40 is adhered to the back surface of the first chip 20 with the adhesive 30, the semiconductor device can be made thinner than conventional semiconductor devices and high-density mounting can be achieved.

Second Embodiment

[Structure]

Figure 5:
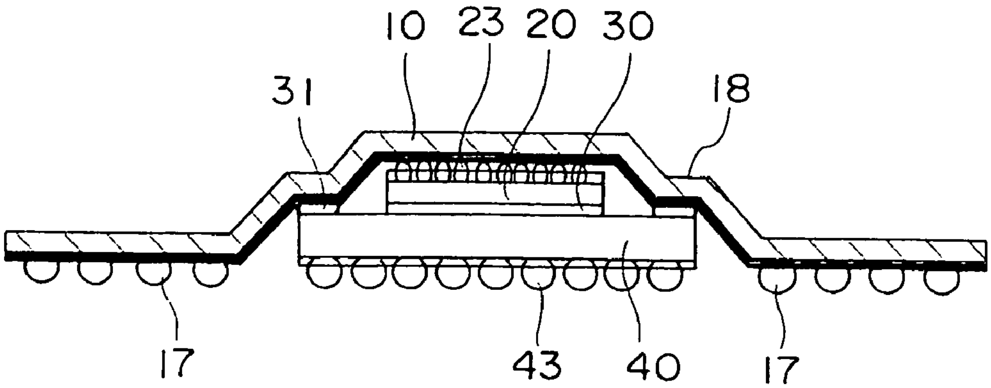
FIG. 5 is a sectional view showing a semiconductor device according to a second embodiment of the invention.

FIG. 5 is a sectional view illustrating a semiconductor device according to the second embodiment of the invention, wherein elements which are common with those in the FIGS. 1 to 4 illustrating the first embodiment are assigned with the common reference numerals.

Similarly to the first embodiment, this semiconductor device has the BGA structure in the 2-chip lamination MCP structure. This semiconductor device differs from that of the first embodiment in that a stepped area 18 is formed in the recess 11 of the metal substrate 10 and that the back surface of the second chip 40, which is larger than the first chip 20 fixed within the recess 11, is adhered to the back surface of the first chip 20 and the stepped area 18 with the adhesives 30 and an adhesive 31. Here, the back surface of the first chip 20 and the stepped area 18 have the same height. Further, the first external terminals 17 of the substrate 10 and the third external terminals 43 on the front surface of the second chip 40 have the same height and the same diameter. Other components are the same as those of the first embodiment.

[Example of Production Method]

Similarly to the first embodiment, the insulating film 12 such as a polyimide resin is formed on the entire back surface of the substrate 10, which is made of a metal such as Cu. Thereafter, using Cu, or the like, sets of the wiring 13, the round pads 14 within the area which will be the recess, and the round posts 15 at the area surrounding the area to be the recess are respectively formed at a plurality of sites of the substrate 10. Subsequently, the insulating film 16 such as a polyimide resin is formed over the entire back surface of the substrate, except for the areas of the pads 14 and posts 15 formed at the plurality of sites, and the pads 14 and the post 15 are plated, for example, with Ni or Au. Then, two-step drawing press to predetermined dimensions using a metal mold, or the like, is performed on the area to be the recess of each of the plurality of sites of the substrate 10, and the stepped area 18 is formed at the first drawn portion and the recess 11 is formed at the second drawn portion. Drawing dimensions are determined according to the size and thickness of the chip 20 and 40 to be mounted.

After the plurality of sites of the substrate 10 are drawn, the external terminals 23, such as solder balls, disposed at the front surface of each of the chips 20 are aligned with and fixed to the pads 14 within each of the recesses 11, and are electrically connected thereto. Then, the adhesive 30, such as a thermosetting insulative paste or a thermoplastic insulative film, is formed on each of the back surfaces of the chips 20, and the adhesive 31 similar to the adhesive 30 is formed on each of the back surfaces of the stepped areas 18, and the back surfaces of the chips 40 are respectively adhered thereto. Thus, the back surfaces of the chips 40 are respectively adhered to the back surfaces of the chips 20 and the stepped areas 18 of the substrate 10 by the adhesives 30 and 31. Thereafter, as with the first embodiment, the external terminals 17 such as solder balls, which have the same diameter and the same height as the external terminals 43 of the chip 40, are formed respectively on the posts 15 disposed at the plurality of sites of the substrate 10. Then, the sites of the substrate 10, on which the chips are mounted, are cut and divided into individual pieces to obtain the semiconductor devices having the BGA structure as shown in FIG. 5.

[Effects]

In addition to the effects provided by the first embodiment, the second embodiment provides the following effect. In the second embodiment, the stepped area 18 is formed within the recess 11 of the substrate 10, and the back surface of the second chip 40 is adhered to the stepped area 18 and the back surface of the first chip 20 with the adhesives 30 and 31. Therefore, a stress applied on portions, at which the external terminals 23 of the first chip 20 are connected to the pads 14, can be reduced, thereby increasing connection strength with the substrate 10.

Third Embodiment

[Structure]

Figure 6:
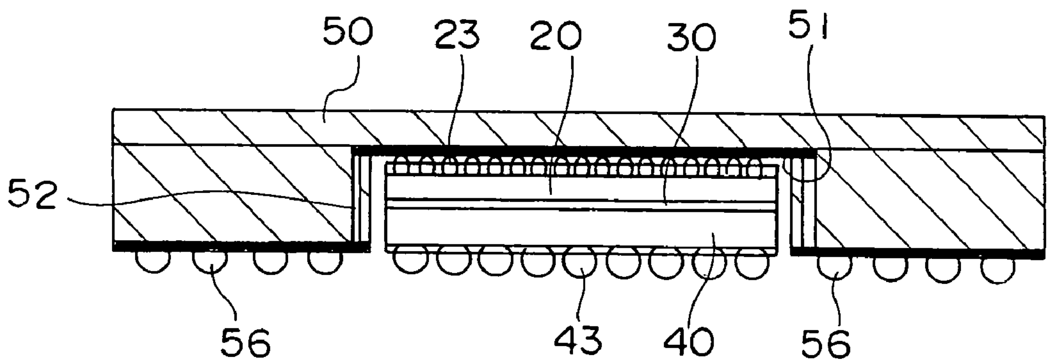
FIG. 6 is a sectional view showing a semiconductor device according to a third embodiment of the invention.

FIG. 6 is a sectional view illustrating a semiconductor device according to the third embodiment of the invention, and FIG. 7 is a partially enlarged view of the semiconductor device of FIG. 6. In these drawings, elements which are common with those in the FIGS. 1A to 41 illustrating the first embodiment are assigned with the common reference numerals.

Similarly to the first embodiment, this semiconductor device has the BGA structure in the 2-chip lamination MCP structure. This semiconductor device differs from that of the first embodiment in that an insulative substrate 50 is used instead of the metal substrate 10, and that the first and second chips 20 and 40, which have the same or almost the same size and are formed of WCSP, are mounted on the substrate.

The insulative substrate 50 is formed, for example, of a laminated glass epoxy substrate. The substrate 50 is provided with recesses 51, which are depressed in a direction from a first (e.g., back) surface to a second (e.g., front) surface of the substrate and have predetermined dimensions, at a plurality of sites of the substrate. The recesses 51 are formed, for example, by counter boring. Using Cu, or the like, wiring 52 is formed, which extends from a bottom surface of each recess 51 via a portion in the substrate to an area around each recess 51. Further, using Cu, or the like, round pads 53 are formed at the bottom surface of each recess 51, and round posts 54 are formed at the area around each recess 51.

The wiring 52 includes a first wiring body **52*a* formed at the bottom surface of each of the recesses 51 and a second wiring body 52*b* formed at the area around each of the recesses 51. The first and second wiring bodies 52*a* and 52*b* are electrically connected with each other via a through hole 52*c* formed in the substrate 50. The pads 53 are electrically connected to the first wiring body 52*a* and the posts 54 are electrically connected to the second wiring body 52*b*. Surfaces of the pads 53 and the posts 54 are plated, for example, with Ni or Au. The entire back surface of the substrate except for the areas of the pads 53 and the posts 54 is covered with an insulating film 55 such as a polyimide resin. First external terminals 56, such as solder balls, are respectively formed on the posts 54**.

Similarly to the first embodiment, the first chip 20 is accommodated in the recess 51. The second external terminals 23 on the front surface of the chip 20 are fixed respectively to the pads 53 at the recess 51. Similarly to the first embodiment, the second chip 40 having the same or almost the same size as the first chip 20 is fixed to the back surface of the first chip 20 with the insulative adhesive 30. The third external terminals 43 on the front surface of the second chip 40 have the same diameter and the same height as first external terminals 56 of the substrate 50.

[Example of Production Method]

The insulative substrate 50, which is formed, for example, of a laminated glass epoxy substrate, is provided with the recesses 51 having predetermined dimensions at a plurality of sites on the back surface thereof. The recesses 51 are formed, for example, by counter boring. Opening dimensions of each of the recesses 51 are about: dimensions of the first chip 20+1 mm; and a depth thereof is: a thickness of the first chip 20+a thickness of the second chip 40+a thickness of portions connecting the second external terminals 23 to the pads 53+a thickness of the adhesive 30. Using Cu, or the like, the wiring 52, the pads 53 and the posts 54 are respectively formed at each of the recesses 51 and the area around each of the recesses 51 of the substrate 50. The surfaces of the pads 53 and the posts 54 are plated, for example, with Ni or Au, and then, the entire back surface of the substrate except for the areas of the pads 53 and the posts 54 is covered with an insulating film 55 such as a polyimide resin.

Using the previously fabricated chips 20 and 40, as with the first embodiment, the external terminals 23, such as solder balls, disposed at the front surface of each of the chips 20 are aligned with and fixed to the pads 53 within each of the recesses 51, and are electrically connected thereto. Then, the insulative adhesive 30 is formed on each of the back surfaces of the chips 20, and the back surfaces of the chips 40 are respectively adhered thereto. Thereafter, the external terminals 56 such as solder balls, which have the same diameter and the same height as the external terminals 43 of the chip 40, are respectively formed on the posts 54, which are disposed at the plurality of sites of the substrate 50. Subsequently, the sites of the substrate 50, on which the chips are mounted, are cut and divided into individual pieces to obtain the semiconductor devices having the BGA structure as shown in FIG. 6.

[Operation]

The external terminals 23 of the first chip 20 are electrically connected to the external terminals 56 via the pads 53, the wiring 52 and the posts 54 at the back surface of the substrate 50. Therefore, by mounting the external terminals 56 of the substrate 50 and the external terminals 43 of the second chip 40 onto a circuit board, or the like, the first and second chips 20 and 40 are electrically connected to the circuit board, or the like, and the semiconductor device performs predetermined operations.

[Effects]

In the third embodiment, the two chips 20 and 40 having the WCSP structure are laminated on the insulative substrate 50, and the following effects (1) to (3) are obtained.

(1) The external terminals 23 of the first chip 20 are fixed to the pads 53 within the recess 51 of the substrate 50, and the back surface of the second chip 40 is adhered to the back surface of the first chip 20 with the adhesive 30. Therefore, a number of parts is smaller than that of conventional semiconductor devices and material costs can be reduced.

(2) Since the two chips 20 and 40 are mounted within the recess 51 of the substrate 50, as with the above (1), a number of production steps is smaller than that of conventional semiconductor devices and productivity can be improved.

(3) Since the front surface of the first chip 20 is fixed within the recess 51 of the substrate 50 and the back surface of the second chip 40 is adhered to the back surface of the first chip 20 with the adhesive 30, the device can be made thinner than conventional semiconductor devices and high-density mounting can be achieved.

Fourth Embodiment

[Structure]

FIG. 8 is a sectional view illustrating a semiconductor device according to the fourth embodiment of the invention, wherein elements which are common with those in the FIG. 6 illustrating the third embodiment are assigned with the common reference numerals.

Similarly to the third embodiment, this semiconductor device has the BGA structure in the 2-chip lamination MCP structure. This semiconductor device differs from that of the third embodiment in that a clearance formed between a wall surface of the recess 51 formed at the back surface of the substrate 50 and the first and second chips 20 and 40 accommodated in the recess 51 is sealed with a sealing body 57 such as a resin. Other components are the same as those of the third embodiment.

[Example of Production Method]

Similarly to the third embodiment, the first and second chips 20 and 40 are fixed in a laminated state within the recess 51 formed at the back surface of the substrate 50. Then, the sealing body 57 formed, for example, of a liquid resin is injected into the recess 51 and is hardened. Thereafter, similarly to the third embodiment, the external terminals 56 such as solder balls, which have the same diameter and the same height as the external terminals 43 of the chip 40, are respectively formed on the posts 54, which are disposed at the plurality of sites of the substrate 50. Subsequently, the sites of the substrate 50, on which the chips are mounted, are cut and divided into individual pieces to obtain the semiconductor devices having the BGA structure as shown in FIG. 8.

[Effects]

In addition to the effects provided by the third embodiment, the fourth embodiment provides the following effect. In the fourth embodiment, the clearance between the wall surface of the recess 51 and the first and second chips 20 and 40 is sealed with the sealing body 57. Therefore, a stress applied on portions, at which the external terminal 23 of the first chip 20 are connected to the pads 53, can be reduced, thereby increasing a connection strength with the substrate 50 and improving reliability.

Fifth Embodiment

[Structure]

Figure 9:
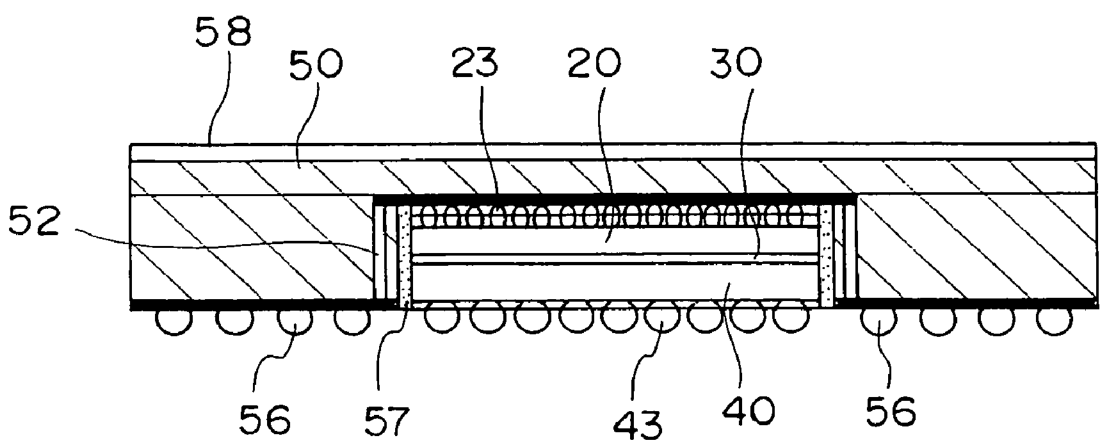
FIG. 9 is a sectional view showing a semiconductor device according to a fifth embodiment of the invention.

FIG. 9 is a sectional view illustrating a semiconductor device according to the fifth embodiment of the invention, wherein elements which are common with those in the FIG. 8 illustrating the fourth embodiment are assigned with the common reference numerals.

In this semiconductor device, the insulative substrate 50 of the fourth embodiment is provided, for example, with a metal heat sink 58 fixed at the front surface the substrate. Other components are the same as those of the fourth embodiment.

[Example of Production Method]

Similarly to the fourth embodiment, the sealing body 57 formed, for example, of a liquid resin is injected into the recess 51 at the back surface of the substrate 50 and is hardened. Thereafter, the metal heat sink 58 is fixed at the front surface of the substrate 50. Then, similarly to the fourth embodiment, the external terminals 56 such as solder balls, which have the same diameter and the same height as the external terminals 43 of the chip 40, are respectively formed on the posts 54, which are disposed at the plurality of sites of the substrate 50. Subsequently, the sites of the substrate 50, on which the chips are mounted, are cut and divided into individual pieces to obtain the semiconductor devices having the BGA structure as shown in FIG. 9.

[Effects]

In addition to the effects provided by the fourth embodiment, the fifth embodiment provides the following effect. In the fifth embodiment, the heat sink 57 is fixed at the front surface of the substrate 50. Therefore, heat generated from the chips 20 and 40 is dissipated by the heat sink 57. This provides excellent heat dissipation, thereby reducing thermal damages on the chips 20 and 40.

Sixth Embodiment

[Structure]

Figure 10A:
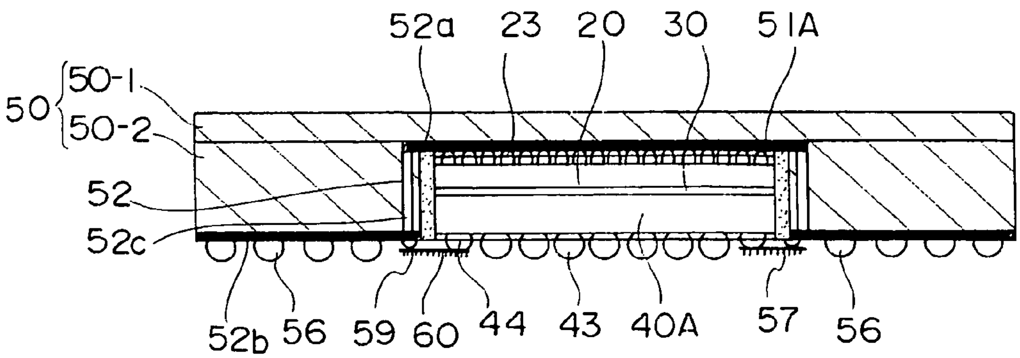
FIGS. 10A and 10B are structural diagrams showing a semiconductor device according to a sixth embodiment of the invention.
Figure 10B:
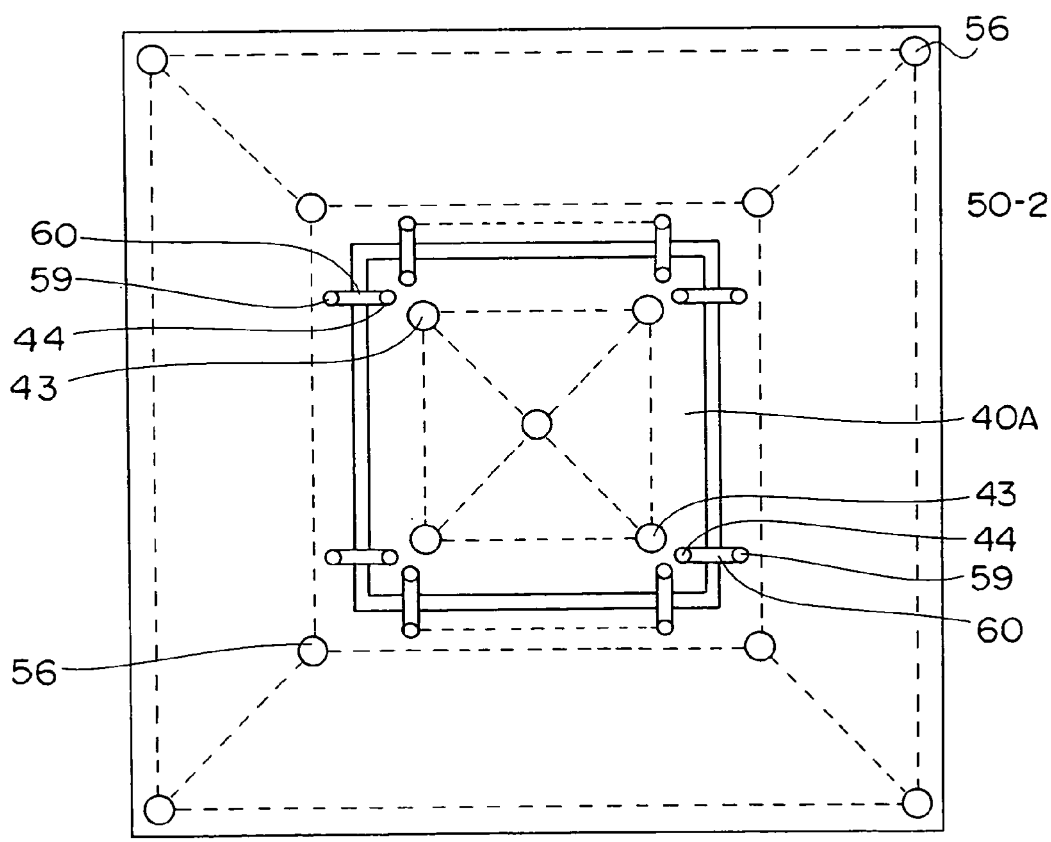

FIGS. 10A and 10B illustrate a structure of a semiconductor device of the sixth embodiment of the invention. FIG.

10A is a sectional view and FIG. 10B is a bottom view (i.e., a back view). In these drawings, elements which are common with those in the FIGS. 6 to 8 illustrating the third and fourth embodiments, are assigned with the common reference numerals.

Similarly to the fourth embodiment, this semiconductor device has the BGA structure in the 2-chip lamination MCP structure. This semiconductor device differs from that of the fourth embodiment shown in FIG. 8 in that a double-layered insulative substrate 50A is used instead of the insulative substrate 50, and that a second chip 40A having second internal connection terminals 44 is used instead of the second chip 40. The second chip 40A is electrically connected to the first chip 20 via the internal connection terminals 44.

Similarly to the second chip 40 of FIG. 8, the second chip 40A has the WCSP structure containing circuit elements such as a memory and a logic circuit. The third external terminals 43 are formed at a fifth (e.g., front) surface of the second chip 40A and the second internal connection terminals 44 are formed in the vicinity of an outer edge at outer sides than the external terminals 43. The external terminals 43 and the internal connection terminals 44 are connected to the internal circuit elements. For example, the external terminals 43 are terminals having relatively large diameter and height such as solder balls. On the other hand, the internal connection terminals 44 are terminals having small diameter and height, which are formed using, for example, a solder paste. The terminals 43 and 44 are usually formed in the same operation.

The double-layered insulative substrate 50A includes a first insulative substrate body 50-1, which is formed, for example, of a single-layered glass epoxy substrate, and a second substrate body 50-2, which is formed, for example, of a glass epoxy substrate and is fixed at a back surface of the substrate body 50-1. The substrate body 50-2 is provided with an opening 51A, which is equivalent to the recess 51 of FIG. 7. Opening dimensions of the opening 51A is about: dimensions of the second chip 40+1 mm; and a depth thereof is not less than: a thickness of the first chip 20+a thickness of the second chip 40+a thickness of connecting portions of the second external terminals 23 of the first chip 20.

As with FIG. 7, first wiring body 52*a* formed of Cu, or the like, and pads 53 connected to the wiring body 52*a* are provided at an area on the back surface of the substrate body 50-1 corresponding to the opening 51A. As with FIG. 7, second wiring body 52*b* formed of Cu, or the like, and posts 54 connected to the wiring body 52*b* are provided at an area surrounding the opening 51A at the back surface of the substrate body 50-2. Further, a through hole 52*c* is formed in the substrate body 50-2, and the through hole 52*c* electrically connects the wiring body 52*a* at the substrate body 50-1 to the wiring body 52*b* at the substrate body 50-2. The wiring bodies 52*a* and 52*b* and the through hole 52*c* form the wiring 52.

As with FIG. 7, the surfaces of the pads 53 and the posts 54 are plated, for example, with Ni or Au. The entire back surface of the substrate body except for the areas of the pads 53 and the posts 54 is covered with the insulating film 55 such as a polyimide resin. First internal connection terminals 59 and the first external terminals 56 are formed on the posts 54. The first internal connection terminals 59 are disposed around the opening 51A, and the first external terminals 56 are disposed at outer sides than the first internal connection terminals 59. For example, the external terminals 56 are terminals having relatively large diameter and height such as solder balls. On the other hand, the internal connection terminals 59 are terminals having small diameter and height, which are formed using, for example, a solder paste. The terminals 56 and 59 are usually formed in the same operation.

The first external terminals 56 at the substrate 50A have the same diameter and the same height as the third external terminals 43 at the front surface of the second chip 40A. The first internal connection terminals 59 at the substrate 50A and the second internal connection terminals 44 at the front surface of the second chip 40A are electrically connected to each other by, for example, soldering conductors 60. A clearance between a wall surface of the opening 51A and the first and second chips 20 and 40A, as well as connecting portions of the conductors 60 are sealed with the sealing body 57 such as a resin.

[Example of Production Method]

Figure 11:
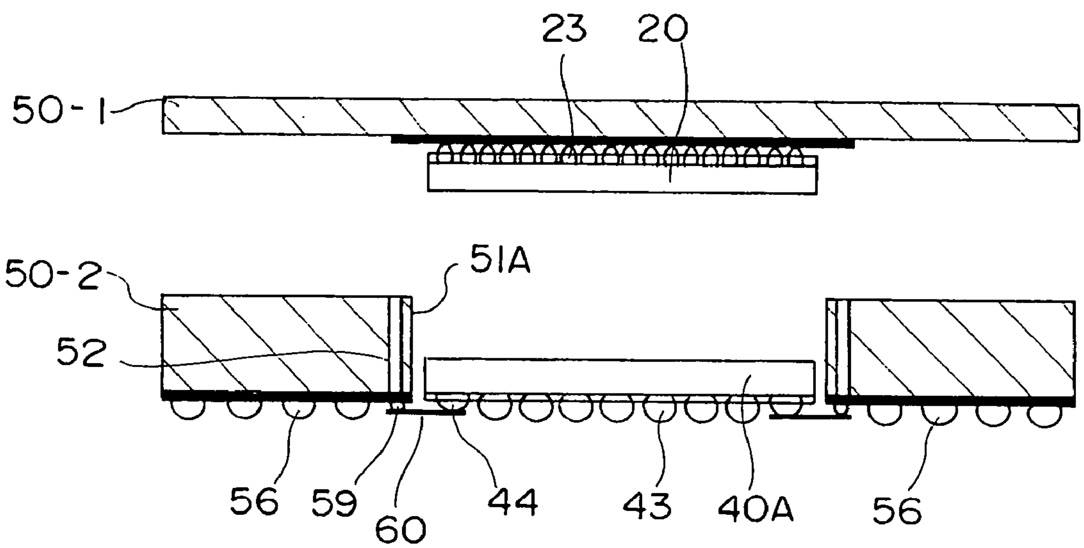
FIG. 11 is an exploded sectional view of the semiconductor device of FIG. 10A.

FIG. 11 is an exploded sectional view of the semiconductor device of FIG. 10A.

As shown in FIG. 11, the external terminals 23 at the front surface of the chip 20 are aligned with and fixed to the pads 53 formed at the back surface of the substrate body 50-1. Further, the chip 40A is inserted in the opening 51A of the substrate body 50-2, and the internal connection terminals 59 provided at the back surface of the substrate body 50-2 and the internal connection terminals 44 provided at the chip 40A are electrically connected to each other by, for example, soldering the conductors 60. Then, the back surface of the substrate body 50-1 mounted with the chip 20 and the front surface of the substrate body 50-2 connected to the chip 40A are aligned and adhered together, the chip 20 and the chip 40A are adhered together with the adhesive 30, and the wiring body 52*a* at the substrate body 50-1 and the through hole 52*c* at the substrate body 50-2 are electrically connected to each other.

Subsequently, the sealing body 57 formed, for example, of a liquid resin is injected into the opening 51A of the substrate body 50-2 and the connecting portions of the conductors 60 and is hardened. Thereafter, the external terminals 56 such as solder balls, which have the same diameter and the same height as the external terminals 43 of the chip 40A, are respectively formed on the posts 54, which are disposed at the plurality of sites of the substrate body 50-2. Then, the sites of the substrate 50A, on which the chips are mounted, are cut and divided into individual pieces to obtain the semiconductor devices having the BGA structure as shown in FIGS. 10A and 10B.

[Operation]

The external terminals 23 of the first chip 20 are electrically connected to the external terminals 43 of the second chip 40A via the pads 53, the wiring body 52*a*, the through hole 52*c*, the wiring body 52*b*, the posts 54, the internal connection terminals 59 and the conductors 60 at the substrate 50A. Therefore, by mounting the external terminals 56 of the substrate 50A and the external terminals 43 of the second chip 40A onto a circuit board, or the like, the semiconductor device performs predetermined operations.

[Effects]

In addition to the effects provided by the fourth embodiment, the sixth embodiment provides the following effects. The first chip 20 and the second chip 40A can be electrically connected simply via the internal connection terminals 44, 59, and the like. This facilitates uniting the two chips to function together, and thus a high-value added semiconductor device can be provided.

The present invention is not limited to the above-described embodiments, and various modifications and types of usage are possible. Examples of such modifications and types of usage are listed in the following (a) to (c).

(a) The substrate 50 of FIG. 6, 8 or 9 may be replaced with the double-layered substrate 50A such as shown in FIGS. 10A and 11.

(b) The heat sink 58 of FIG. 9 may be fixed to the semiconductor device of FIG. 6, FIGS. 10A and 10B or FIG. 11.

(c) Shapes, structures and materials of the components in the first to sixth embodiments can be changed from those shown in the drawings.

As the chips to be mounted, those having a package structure other than the WCSP can also be applied. Further, by devising the structure of the substrate, three or more chips can be mounted. Moreover, the external terminals may have a structure other than the BGA structure, such as a lead structure.

What is claimed is:

1. A semiconductor device comprising:

a substrate including opposed first and second surfaces and a recess which is depressed in a direction from the first surface to the second surface, the first surface including the recess being covered with an insulating film;

pads formed on the insulating film at a bottom surface of the recess;

first external terminals formed on the insulating film on the first surface at an area surrounding the recess;

wiring formed on the insulating film on the first surface for electrically connecting the pads to the first external terminals;

a first semiconductor element including a third surface, on which second external terminals are formed, and a fourth surface opposed to the third surface, the first semiconductor element being accommodated in the recess and the second external terminals being electrically connected to the pads;

a second semiconductor element including a fifth surface, on which third external terminals are formed, and a sixth surface opposed to the fifth surface, the second semiconductor element being accommodated in the recess and the sixth surface thereof being adhered to the fourth surface of the first semiconductor element.

2. The semiconductor device according to claim 1, wherein the substrate is a metal substrate.

3. The semiconductor device according to claim 1, wherein the third external terminals are disposed at the same height as the first external terminals.

4. The semiconductor device according to claim 1, wherein a stepped area is formed in the recess of the substrate, the second semiconductor element is accommodated in the recess and the sixth surface thereof is fixed to the fourth surface and the stepped area, and the third external terminals are disposed at the same height as the first external terminals.

5. A semiconductor device comprising:

an insulative substrate including opposed first and second surfaces and a recess having predetermined dimensions formed in the first surface;

pads formed at a bottom surface of the recess;

first external terminals formed on the first surface at an area surrounding the recess;

wiring formed on the substrate for electrically connecting the pads to the first external terminals;

a first semiconductor element including a third surface, on which second external terminals are formed, and a fourth surface opposed to the third surface, the first semiconductor element being accommodated in the recess and the second external terminals being fixed to the pads; and a second semiconductor element including a fifth surface, on which third external terminals are formed, and a sixth surface opposed to the fifth surface, the second semiconductor element being accommodated in the recess, the sixth surface thereof being fixed to the fourth surface, and the third external terminals being disposed at the same height as the first external terminals.

6. A semiconductor device comprising:

an insulative substrate including opposed first and second surfaces and a recess having predetermined dimensions formed in the first surface;

pads formed at a bottom surface of the recess;

first internal connection terminals formed on the first surface at an area surrounding the recess;

first external terminals formed on the first surface at outer sides than the first internal connection terminals;

wiring formed on the substrate for electrically connecting the pads to the first internal connection terminals and the first external terminals;

a first semiconductor element including a third surface, on which second external terminals are formed, and a fourth surface opposed to the third surface, the first semiconductor element being accommodated in the recess and the second external terminals being fixed to the pads; and a second semiconductor element including a fifth surface, on which third external terminals are formed and second internal connection terminals are formed in the vicinity of an outer edge at outer sides than the third external terminals, and a sixth surface opposed to the fifth surface, the second semiconductor element being accommodated in the recess, the sixth surface thereof being fixed to the fourth surface, the second internal connection terminals being electrically connected to the first internal connection terminals, and the third external terminals being disposed at the same height as the first external terminals.

7. The semiconductor device according to claim 5, wherein the wiring comprises a first wiring body formed at the bottom surface of the recess and electrically connected to the pads, a second wiring body formed on the first surface at an area surrounding the recess and electrically connected to the first external terminals, and a through hole formed in the substrate for electrically connecting the first wiring body to the second wiring body.

8. The semiconductor device according to claim 6, wherein the wiring comprises a first wiring body formed at the bottom surface of the recess and electrically connected to the pads, a second wiring body formed on the first surface at an area surrounding the recess and electrically connected to the first internal connection terminals and the first external terminals, and a through hole formed in the substrate for electrically connecting the first wiring body to the second wiring body.

9. The semiconductor device according to claim 5, wherein the substrate comprises a first insulative substrate body and a second insulative substrate body, the second insulative substrate body including an opening, which forms the recess, and being fixed to a back surface of the first substrate body.

10. The semiconductor device according to claim 6, wherein the substrate comprises a first insulative substrate body and a second insulative substrate body, the second insulative substrate body including an opening, which forms the recess, and being fixed to a back surface of the first substrate body.

11. The semiconductor device according to claim 5, wherein a clearance between a wall surface of the recess and the first and second semiconductor elements is sealed with a sealing body.

12. The semiconductor device according to claim 6, wherein a clearance between a wall surface of the recess and the first and second semiconductor elements is sealed with a sealing body.

13. The semiconductor device according to claim 5, further comprising a heat sink fixed at the second surface of the substrate.

14. The semiconductor device according to claim 6, further comprising a heat sink fixed at the second surface of the substrate.

15. The semiconductor device according to claim 1, wherein the first semiconductor element comprises a wafer level chip size package where the second external terminals are arranged planarly by rewiring from internal electrodes provided with an insulating coating, and the second semiconductor element comprises a wafer level chip size package where the third external terminals are arranged planarly by rewiring from internal electrodes provided with an insulating coating.

16. The semiconductor device according to claim 5, wherein the first semiconductor element comprises a wafer level chip size package where the second external terminals are arranged planarly by rewiring from internal electrodes provided with an insulating coating, and the second semiconductor element comprises a wafer level chip size package where the third external terminals are arranged planarly by rewiring from internal electrodes provided with an insulating coating.

17. The semiconductor device according to claim 6, wherein the first semiconductor element comprises a wafer level chip size package where the second external terminals are arranged planarly by rewiring from internal electrodes provided with an insulating coating, and the second semiconductor element comprises a wafer level chip size package where the third external terminals are arranged planarly by rewiring from internal electrodes provided with an insulating coating.

* * * * *